US011800292B2

(12) United States Patent
Inoue et al.

(10) Patent No.: US 11,800,292 B2
(45) Date of Patent: Oct. 24, 2023

(54) SOUND PRODUCING DEVICE AND METHOD OF MANUFACTURING SOUND PRODUCING DEVICE

(71) Applicant: HOSIDEN CORPORATION, Osaka (JP)

(72) Inventors: Ryo Inoue, Osaka (JP); Tadashi Hanai, Osaka (JP); Satoru Fujiwara, Osaka (JP)

(73) Assignee: HOSIDEN CORPORATION, Osaka (JP)

( * ) Notice: Subject to any disclaimer, the term of this patent is extended or adjusted under 35 U.S.C. 154(b) by 553 days.

(21) Appl. No.: 16/784,792

(22) Filed: Feb. 7, 2020

(65) Prior Publication Data

US 2020/0267477 A1 Aug. 20, 2020

(30) Foreign Application Priority Data

Feb. 18, 2019 (JP) ................................ 2019-026469

(51) Int. Cl.
*H04R 17/00* (2006.01)
*H01L 41/187* (2006.01)
(Continued)

(52) U.S. Cl.
CPC ........... *H04R 17/00* (2013.01); *H10N 30/073* (2023.02); *H10N 30/853* (2023.02)

(58) Field of Classification Search
CPC ..... H04R 17/00; H01L 41/187; H01L 41/313; H10N 30/073; H10N 30/853
(Continued)

(56) References Cited

U.S. PATENT DOCUMENTS 3,433,461 A * 3/1969 Scarpa ................ B05B 17/0669
366/115
2012/0313484 A1 12/2012 Kim et al.

FOREIGN PATENT DOCUMENTS

| JP | 58-125500 | 8/1983 |
| JP | 1-170299 A | 7/1989 |
| JP | 2003-304597 | 10/2003 |

OTHER PUBLICATIONS

Jul. 5, 2022 Japanese Office Action in Japanese Application No. 2019-026469 and translation thereof.
(Continued)

*Primary Examiner* — Shawki S Ismail
*Assistant Examiner* — Monica Mata
(74) *Attorney, Agent, or Firm* — GREENBLUM & BERNSTEIN, P.L.C.

(57) ABSTRACT

A sound producing device in which an adhesive layer between a piezoelectric element and a metal plate has sufficient electrical conductivity includes: a metal plate; a piezoelectric ceramic including a first adhesion surface, the first adhesion surface being a surface bonded to the metal plate; an alternating current power supply that applies an alternating voltage to the piezoelectric ceramic; and an adhesive layer formed from conductive adhesive and thermosetting adhesive which are spread over the first adhesion surface, the conductive adhesive being applied in a center portion of the first adhesion surface and the thermosetting adhesive being applied at three or more locations in a periphery of the first adhesion surface. An adhesion surface of the metal plate that is bonded to the piezoelectric ceramic is a second adhesion surface, and the first adhesion surface and the second adhesion surface are bonded together by the adhesive layer.

13 Claims, 3 Drawing Sheets

(51) Int. Cl.
 *H01L 41/313* (2013.01)
 *H10N 30/073* (2023.01)
 *H10N 30/853* (2023.01)

(58) Field of Classification Search
 USPC .......................................................... 310/311
 See application file for complete search history.

(56) References Cited

OTHER PUBLICATIONS

Dec. 6, 2022 Decision of Refusal in corresponding Japanese Application No. 2019-026469.

* cited by examiner

SOUND PRODUCING DEVICE AND METHOD OF MANUFACTURING SOUND PRODUCING DEVICE

TECHNICAL FIELD

The present invention relates to a sound producing device and a method of manufacturing the sound producing device.

BACKGROUND ART

Conventional techniques for piezoelectric diaphragms include Japanese Patent Application Laid Open No. H1-170299 (hereinafter referred to as Patent Literature 1), for example. The piezoelectric diaphragm described in Patent Literature 1 is formed of a piezoelectric element and a metallic sheet bonded to each other via an adhesive layer. The adhesive layer between the piezoelectric element and the metallic sheet is formed by use of conductive adhesive containing a mixture of an electrically conductive substance and an organic material such as resin solution.

Conductive adhesive has the disadvantages of being brittle and involving high material cost compared with other types of adhesive.

When conductive adhesive is substituted for thermosetting adhesive, the strength increases and the material cost decreases. At the same time, the piezoelectric element and the metallic sheet become electrically isolated from each other and a complicated structure is required for application of voltage to the piezoelectric element, thus leading to increase in the manufacturing cost as well as time and effort.

SUMMARY OF THE INVENTION

Thus, an object of the present invention is to provide a sound producing device which is low cost and has high strength and in which an adhesive layer between a piezoelectric element and a metal plate has sufficient electrical conductivity.

A sound producing device according to the present invention includes: a metal plate; a piezoelectric ceramic including a first adhesion surface, the first adhesion surface being a surface bonded to the metal plate; an alternating current power supply that applies an alternating voltage to the piezoelectric ceramic; and an adhesive layer formed from conductive adhesive and thermosetting adhesive which are spread over the first adhesion surface, the conductive adhesive being applied in a center portion of the first adhesion surface and the thermosetting adhesive being applied at three or more locations in a periphery of the first adhesion surface. An adhesion surface of the metal plate that is bonded to the piezoelectric ceramic is a second adhesion surface, and the first adhesion surface and the second adhesion surface are bonded together by the adhesive layer.

Effects of the Invention

The sound producing device according to the present invention is low cost and has high strength, and the adhesive layer between the piezoelectric element and the metal plate has sufficient electrical conductivity.

DETAILED DESCRIPTION

An embodiment of the present invention is described below in detail. In the description, components with the same functionality are given the same numerals and redundant description is omitted.

First Embodiment

Figure 1:
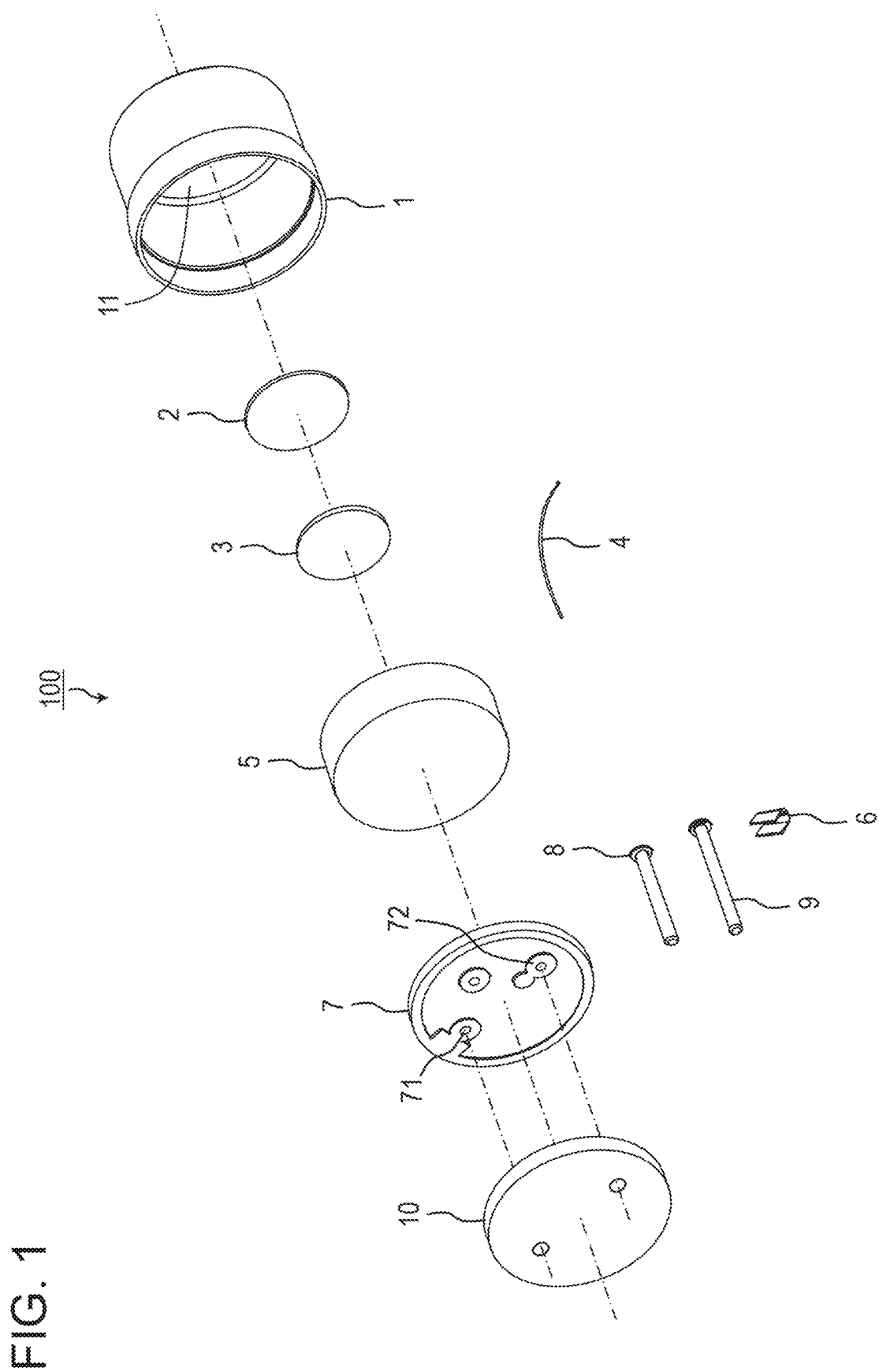
FIG. 1 is an exploded perspective view of a sound producing device according to a first embodiment.

Referring to FIG. 1, a sound producing device 100 according to a first embodiment is described. As shown in FIG. 1, the sound producing device 100 includes: a tubular metallic casing 1 having a bottom surface and a cylindrical surface and being open at a top; a thin, disk-shaped adhesive layer 2; a thin, disk-shaped piezoelectric ceramic (piezoelectric element) 3 bonded to the bottom surface (an inner surface) of the metallic casing 1 by the adhesive layer 2; a disk-shaped substrate 7; a cable 4 which electrically connects the piezoelectric ceramic (piezoelectric element) 3 and the substrate 7 to each other; a disk-shaped sponge 5 lying between the piezoelectric ceramic (a piezoelectric element) 3 and the substrate 7; a copper foil 6 for fixing the cable 4 to the substrate 7; a minus-side pin 8 and a plus-side pin 9 welded to an upper surface of the substrate 7; and a disk-shaped sealing material 10.

<Metallic Casing 1 and Sealing Material 10>

The tubular metallic casing 1 houses the adhesive layer 2, the piezoelectric ceramic 3, the cable 4, the sponge 5, the copper foil 6, the substrate 7, the minus-side pin 8, and the plus-side pin 9 in this order from the bottom side, and its top opening is covered by the sealing material 10. For the material of the metallic casing, aluminum may be chosen, for example. A plate at the bottom of the metallic casing 1 is referred to as a metal plate 11.

<Adhesive Layer 2>

Figure 2:
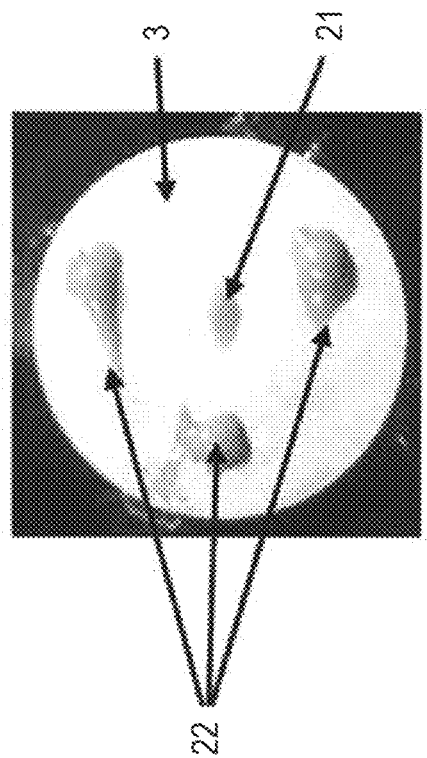
FIG. 2 illustrates making of an adhesive layer in the first embodiment.

As shown in FIG. 2, the adhesive layer 2 is formed by applying a conductive adhesive 21 (for example, silver paste, or it may be metal like gold, copper, and nickel as substitutes for silver, or carbon) in a center portion of a first adhesion surface, which is a surface of the piezoelectric ceramic 3 that is bonded to the metal plate 11, and a thermosetting adhesive 22 (for example, epoxy-based adhesive) at three or more locations (for example, three locations, or four locations) in a periphery of the first adhesion surface, and by spreading the conductive adhesive 21 and the thermosetting adhesive 22 over the first adhesion surface. The thermosetting adhesive was chosen in the interest of high-temperature property as a product performance. For the conductive adhesive 21 and the thermosetting adhesive 22, adhesives having similar drying and curing conditions are preferably chosen. The curing condition of the thermosetting adhesive 22 may be at 150° C. for one hour, for example. The first adhesion surface of the piezoelectric ceramic 3 and a second adhesion surface, which is the adhesion surface of the metal plate 11, are bonded together by the adhesive layer 2.

As alternatives for the thermosetting adhesive 22, two part reactive adhesive and UV anaerobic adhesive can also be used.

<Piezoelectric Ceramic 3>

The piezoelectric ceramic 3 is connected to one end of the cable 4 and is energized through the cable 4. When an alternating voltage is applied to the piezoelectric ceramic 3, the piezoelectric ceramic 3 repeats elongation and contraction.

<Cable 4>

As just mentioned, one end of the cable 4 is connected with the piezoelectric ceramic 3. The other end of the cable 4 is welded to a power circuit on the substrate 7. The cable 4 may be polyurethane wire, for example.

<Sponge 5>

The sponge 5 has a hole for insertion of the cable 4.

<Copper Foil 6>

The copper foil 6 is attached to the substrate 7 so as to cover a portion where the other end of the cable 4 is welded to the substrate 7 in order to increase the strength of the portion.

<Substrate 7>

A conductive part 71 of the substrate 7 is connected with one end of the minus-side pin 8, and a conductive part 72 is connected with one end of the plus-side pin 9.

<Minus-Side Pin 8 and Plus-Side Pin 9>

The other ends of the minus-side pin 8 and the plus-side pin 9 penetrate the sealing material 10 and are exposed to the outside. The other ends of the minus-side pin 8 and the plus-side pin 9 are connected with an alternating current power supply, not shown. The alternating current power supply applies an alternating voltage to the piezoelectric ceramic 3.

<Method of Manufacturing Sound Producing Device 100>

Figure 3:
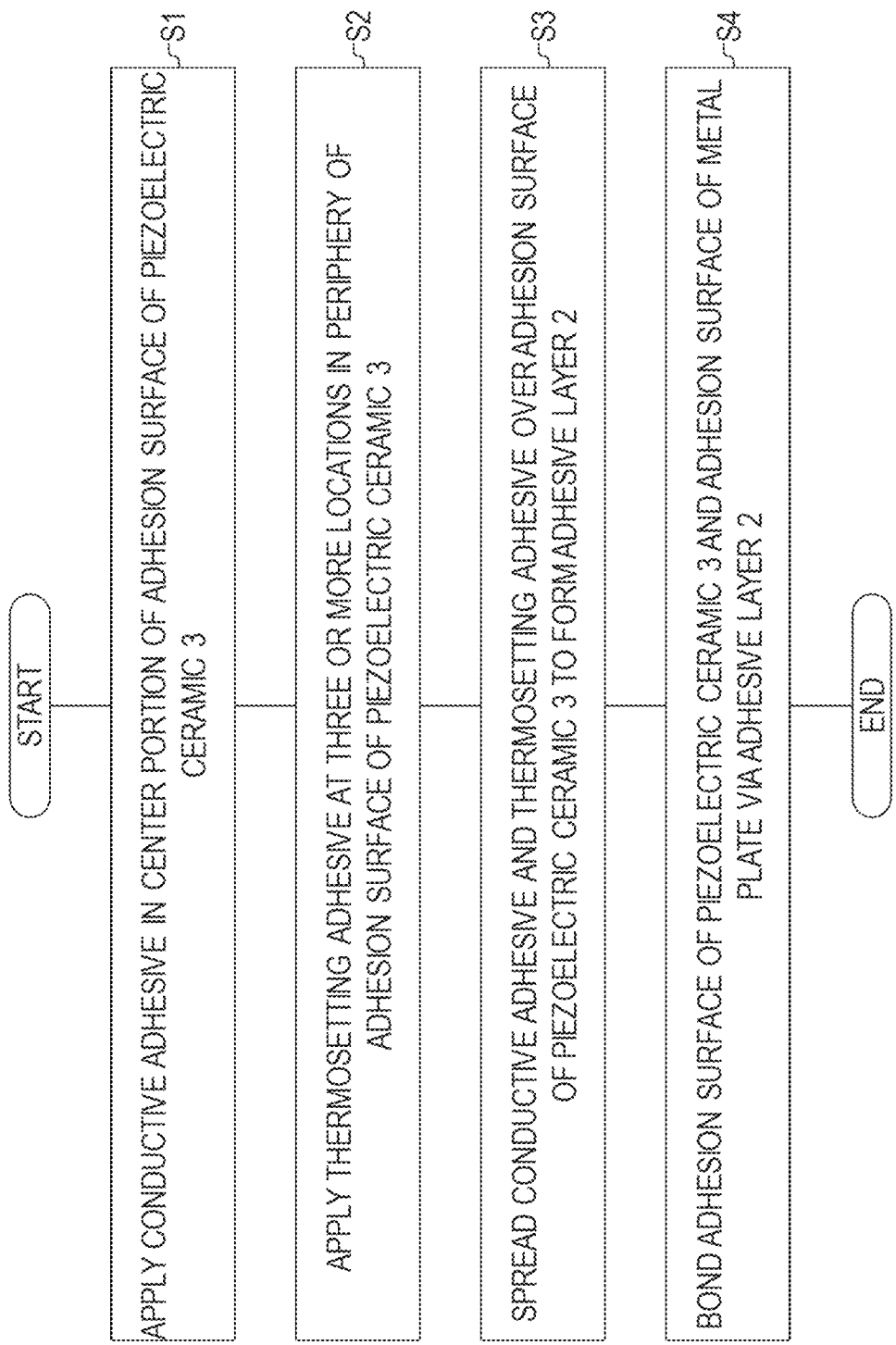
FIG. 3 is a flowchart illustrating a method of manufacturing the sound producing device of the first embodiment.

As shown in FIG. 3, a method of manufacturing the sound producing device 100, in particular a method of bonding the piezoelectric ceramic 3 and the metal plate 11, includes steps S1 to S4. First, the conductive adhesive 21 is applied in a center portion of the adhesion surface (the first adhesion surface) of the piezoelectric ceramic 3 (S1, see FIG. 2). Next, the thermosetting adhesive 22 is applied at three or more locations in the periphery of the adhesion surface (the first adhesion surface) of the piezoelectric ceramic 3 (S2, see FIG. 2). Then, the conductive adhesive 21 and the thermosetting adhesive 22 are spread over the adhesion surface of the piezoelectric ceramic 3 to form the adhesive layer 2 (S3). For example, preferably, a pressing load of around 300 g is applied to the adhesives that have been applied in small amounts in the periphery and the center portion of the adhesion surface (the first adhesion surface) of the piezoelectric ceramic 3, thus extending the adhesive layer 2 down to a thickness of around 10 μm. Then, via the adhesive layer 2, the adhesion surface (the first adhesion surface) of the piezoelectric ceramic 3 and the adhesion surface (the second adhesion surface) of the metal plate 11 are bonded together (S4). In practice, S3 and S4 are typically performed simultaneously.

As the sound producing device 100 uses the conductive adhesive 21 in the center portion of the adhesive layer 2, direct current resistance in the adhesive layer 2 can be reduced and almost no loss associated with voltage division occurs in the voltage applied to the piezoelectric ceramic 3. This allows d33 constant to be effectively exerted. Furthermore, since the thermosetting adhesive 22 strengthens the mechanical connection between the periphery of the piezoelectric ceramic 3 and the metal plate 11, vibration of the piezoelectric ceramic 3 is transmitted to the metal plate 11 with almost no loss, resulting in good characteristics. With the foregoing, manufacturing condition settings (control standards) are relaxed, productivity is improved, and the usage of expensive Ag is also reduced.

The foregoing description of the embodiment of the invention has been presented for the purpose of illustration and description. It is not intended to be exhaustive and to limit the invention to the precise form disclosed. Modifications or variations are possible in light of the above teaching. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A sound producing device comprising:
   a metal plate;
   a piezoelectric ceramic including a first adhesion surface, the first adhesion surface being a surface bonded to the metal plate;
   an alternating current power supply that applies an alternating voltage to the piezoelectric ceramic; and
   an adhesive layer formed from conductive adhesive and thermosetting adhesive which are spread over the first adhesion surface, the conductive adhesive being applied in a center portion of the first adhesion surface and the thermosetting adhesive being applied at multiple locations in a periphery of the first adhesion surface, wherein
   an adhesion surface of the metal plate that is bonded to the piezoelectric ceramic is a second adhesion surface, and the first adhesion surface and the second adhesion surface are bonded together by the adhesive layer.

2. The sound producing device according to claim 1, wherein the conductive adhesive is silver paste.

3. The sound producing device according to claim 1, wherein the thermosetting adhesive is epoxy-based adhesive.

4. The sound producing device according to claim 1, wherein the multiple locations are three or more locations.

5. The sound producing device according to claim 1, wherein the conductive adhesive is composed of one of gold, copper, nickel, and carbon.

6. The sound producing device according to claim 1, wherein the conductive adhesive is first applied at the center portion of the first adhesion surface and then spread over the first adhesion surface, and the thermosetting adhesive is first applied at three or more locations in the periphery of the first adhesion surface and then spread over the first adhesion surface.

7. The sound producing device according to claim 1, wherein the thermosetting adhesive has the curing property of being curable by heating at 150° C. for one hour.

8. The sound producing device according to claim 1, further comprising:
   a tubular metal casing having the metal plate as a bottom surface thereof, and being open at the top;
   a disk-shaped sponge on top of the piezoelectric ceramic and having a hole therein;
   a disk-shaped substrate on top of the disk-shaped sponge, so that the disk-shaped sponge is sandwiched between the piezoelectric ceramic and the disk-shaped substrate;
   a cable that electrically connects the piezoelectric ceramic and a power circuit of the disk-shaped substrate to each other and passes through the hole in the sponge;

a copper foil fixing the cable to the disk-shaped substrate and covering a portion where an end of the cable is attached to the disk-shaped substrate, thereby increasing the strength thereof;

a minus-side pin and a plus-side pin welded to an upper surface of the substrate, the minus-side pin and the plus-side pin being spaced from each other on the upper surface of the substrate; and a disk-shaped sealing material on the upper surface of the disk-shaped substrate, wherein the tubular metal casing houses the adhesive layer, the piezoelectric ceramic, the cable, the sponge, the copper foil, the substrate, the minus-side pin, and the plus-side pin in this order from its bottom side, and its top opening is covered by the sealing material, and one end of the minus-side pin and one end of the plus-side pin penetrate the sealing material and are exposed to the outside.

9. A method of manufacturing a sound producing device comprising:

a step of applying conductive adhesive in a center portion of an adhesion surface of a piezoelectric ceramic;

a step of applying thermosetting adhesive at multiple locations in a periphery of the adhesion surface of the piezoelectric ceramic;

a step of spreading the conductive adhesive and the thermosetting adhesive over the adhesion surface of the piezoelectric ceramic to form an adhesive layer; and a step of bonding the adhesion surface of the piezoelectric ceramic and an adhesion surface of a metal plate together via the adhesive layer.

10. The method of manufacturing a sound producing device according to claim 9, wherein the conductive adhesive is silver paste.

11. The method of manufacturing a sound producing device according to claim 9, wherein the thermosetting adhesive is epoxy-based adhesive.

12. The method of manufacturing a sound producing device according to claim 9, wherein the multiple locations are three or more locations.

13. A sound producing device comprising:

a metal plate;

a piezoelectric ceramic including a first adhesion surface, the first adhesion surface being a surface bonded to the metal plate;

an alternating current power supply that applies an alternating voltage to the piezoelectric ceramic; and an adhesive layer formed from conductive adhesive and a two part reactive adhesive and UV anaerobic adhesive which are spread over the first adhesion surface, the conductive adhesive being applied in a center portion of the first adhesion surface and the two part reactive adhesive and UV anaerobic adhesive being applied at three or more locations in a periphery of the first adhesion surface, wherein an adhesion surface of the metal plate that is bonded to the piezoelectric ceramic is a second adhesion surface, and the first adhesion surface and the second adhesion surface are bonded together by the adhesive layer.

* * * * *